United States Patent
Meier et al.

(10) Patent No.: US 10,297,497 B2
(45) Date of Patent: May 21, 2019

(54) SACRIFICIAL LAYER FOR PLATINUM PATTERNING

(71) Applicant: TEXAS INSTRUMENTS INCORPORATED, Dallas, TX (US)

(72) Inventors: Sebastian Meier, Munich (DE); Helmut Rinck, Bavaria (DE); Kai-Alexander Schachtschneider, Rohrbach (DE); Fromund Metz, Marzling (DE); Mario Schmidpeter, Munich (DE); Javier Gustavo Moreira, Buch am Elbach (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/658,039

(22) Filed: Jul. 24, 2017

(65) Prior Publication Data
US 2018/0204767 A1 Jul. 19, 2018

Related U.S. Application Data
(60) Provisional application No. 62/448,110, filed on Jan. 19, 2017.

(51) Int. Cl.
*H01L 21/285* (2006.01)
*H01L 21/311* (2006.01)
(Continued)

(52) U.S. Cl.
CPC .... *H01L 21/76865* (2013.01); *H01L 21/2855* (2013.01); *H01L 21/31111* (2013.01); *H01L 21/32139* (2013.01)

(58) Field of Classification Search
CPC ......... H01L 21/31111; H01L 21/32139; H01L 21/2855; H01L 21/76865; H01L 21/7688
(Continued)

(56) References Cited

U.S. PATENT DOCUMENTS 5,679,213 A * 10/1997 Noshiro ............ H01L 21/02071
204/192.35
5,914,507 A    6/1999 Polla et al.
(Continued)

FOREIGN PATENT DOCUMENTS
RU    2426193    8/2011

OTHER PUBLICATIONS

Patent Cooperation Treaty Search Report, dated May 31, 2018, PCT/US 2018/014531.

*Primary Examiner* — Jasmine J Clark
(74) *Attorney, Agent, or Firm* — Jacqueline J. Garner; Charles A. Brill; Frank D. Cimino (57) ABSTRACT

In accordance with at least one embodiment of the disclosure, a method of patterning platinum on a substrate is disclosed. In an embodiment, an adhesive layer is deposited over the substrate, a sacrificial layer is deposited over the adhesive layer, and a patterned photoresist layer is formed over the sacrificial layer. Then, the sacrificial layer is patterned utilizing the photoresist layer as a mask such that at least a portion of the adhesive layer is exposed. Subsequently, the top and sidewall surfaces of the patterned sacrificial layer and the first portion of the adhesive layer are covered by a platinum layer. Finally, the sacrificial layer and a portion of the platinum layer covering the top and sidewall surfaces of the sacrificial layer are etched, thereby leaving a remaining portion of the platinum layer to form a patterned platinum layer on the substrate.

20 Claims, 5 Drawing Sheets

(51) Int. Cl.
*H01L 21/768* (2006.01)
*H01L 21/3213* (2006.01)

(58) Field of Classification Search
USPC .................................................. 438/654, 688
See application file for complete search history.

(56) References Cited

U.S. PATENT DOCUMENTS

| | | |
|---|---|---|
| 6,187,686 B1 | 2/2001 | Shin et al. |
| 6,218,297 B1 * | 4/2001 | Marsh ............... H01L 21/76843 |
| | | 257/E21.009 |
| 2003/0132522 A1 * | 7/2003 | Alie ..................... B81B 7/0006 |
| | | 257/758 |
| 2014/0302406 A1 | 10/2014 | Cardenas-Valencia et al. |
| 2015/0037974 A1 | 2/2015 | Lu et al. |
| 2016/0223404 A1 | 8/2016 | Samarao et al. |

* cited by examiner

SACRIFICIAL LAYER FOR PLATINUM PATTERNING

CROSS-REFERENCE TO RELATED APPLICATIONS

The present application claims priority to U.S. Provisional Patent Application No. 62/448,110, filed Jan. 19, 2017, titled "Aluminum Sacrificial Layer for Platinum Patterning," which is hereby incorporated herein by reference in its entirety.

BACKGROUND

The present subject matter relates generally to semiconductor devices, and more particularly to methods of patterning a platinum layer on a substrate.

Conventionally, aluminum and copper are widely used for metallization purposes in integrated circuits (ICs). However, humidity may cause reliability problems for ICs that utilize such metals. For example, in the case of electrochemical sensors, the ICs are commonly exposed to fluids. The exposure of aluminum and copper to humidity may result in corrosion of the metallization and may also cause short circuits within the ICs.

To overcome these issues, platinum may be used instead of aluminum or copper as the metallization layer. Not only does platinum have excellent resistance against corrosion, it also is relatively stable at high temperatures. However, known methods of patterning platinum are unreliable. One common problem with these methods is that the patterning does not produce an appropriate feature size for the desired structures. Additionally, the known methods may introduce unacceptable levels of contaminants.

SUMMARY

In accordance with at least one embodiment of the disclosure, a method of patterning platinum on a substrate is disclosed. In this embodiment, an adhesive layer is deposited over the substrate, a sacrificial layer is deposited over the adhesive layer, and a patterned photoresist layer is formed over the sacrificial layer. Then, the sacrificial layer is patterned utilizing the photoresist layer as a mask such that at least a portion of the adhesive layer is exposed. Subsequently, the top and sidewall surfaces of the patterned sacrificial layer and the first portion of the adhesive layer are covered by a platinum layer. Finally, the sacrificial layer and a portion of the platinum layer covering the top and sidewall surfaces of the sacrificial layer are etched, thereby leaving a remaining portion of the platinum layer to form a patterned platinum layer on the substrate.

In another embodiment, a sacrificial layer is deposited over a substrate and a patterned photoresist layer is formed over the sacrificial layer. The sacrificial layer is then patterned utilizing the photoresist layer as a mask to expose a portion of a top surface of the substrate. A platinum layer is sputter deposited on top of the substrate, wherein the platinum layer covers the patterned sacrificial layer and the exposed portion of the top surface of the substrate. Finally, the patterned sacrificial layer and a portion of the platinum layer covering the patterned sacrificial layer are removed, thereby leaving a remaining portion of the platinum layer to form a patterned platinum layer on the substrate.

In yet another embodiment, a titanium layer is deposited over a semiconductor substrate, an aluminum layer is deposited over the titanium layer, and a patterned photoresist layer is formed over the aluminum layer. Then, a portion of the aluminum layer is removed to expose a first portion of the titanium layer. A platinum layer may be deposited over top and sidewall surfaces of the aluminum layer and the first portion of the titanium layer. Finally, the aluminum layer and a portion of the platinum layer covering the top and sidewall surfaces of the aluminum layer is etched, thereby leaving a remaining portion of the platinum layer covering the first portion of the titanium layer to form a patterned platinum.

BRIEF DESCRIPTION OF THE DRAWINGS

For a detailed description of various examples, reference will now be made to the accompanying drawings in which.

DETAILED DESCRIPTION

In accordance with at least one embodiment of the disclosure, a method of patterning platinum on a substrate is disclosed. In this embodiment, the platinum is patterned using a sacrificial layer made from, for example, aluminum. The undesired portion of the platinum (i.e., the portion of the platinum not to be part of the intended pattern) may be formed over the sacrificial layer. An etching process is performed using a wet etching agent that begins to etch through the platinum layer. The etchant etches through the platinum layer where the platinum layer is the thinnest. Once an opening is formed in the platinum layer, the etchant is then able to etch the underlying sacrificial layer. The sacrificial layer reacts with the etchant at a faster rate than the platinum layer and, thus the sacrificial layer is etched more rapidly than the platinum layer. As a result, the etched sacrificial layer is removed from the substrate along with the undesired portion of the platinum layer which was formed on the sacrificial layer. The remaining portion of the platinum layer, not on the sacrificial layer, and which was etched at a much slower rate remains in place on the substrate, thereby forming the desired patterned platinum on the substrate.

As discussed above, other methods of patterning platinum may not provide reliable results. For example, it is difficult to obtain the desirable critical dimensions (i.e. feature size and pitch) for the platinum patterns using known methods.

Furthermore, these processes typically cause contaminations in the machines and devices involved. Finally, reclaiming the consumed platinum in the conventional methods is difficult and expensive. However, methods according to embodiments of the disclosure discussed below improve the critical dimensions of the platinum structures, reduce contamination, and facilitate recycling of the consumed platinum.

Figure 1A:
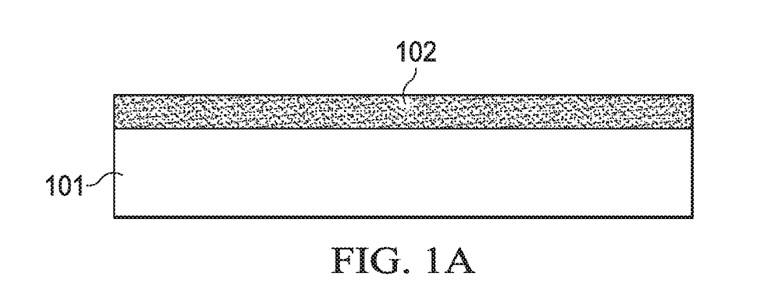
FIG. 1A shows an adhesive layer formed over a substrate in accordance with an embodiment of the disclosure.

Referring to FIG. 1A to FIG. 1H, a process of patterning platinum according to embodiments of the disclosure is described. Referring to FIG. 1A, a substrate 101 is used as the base for forming the platinum structure. The substrate may comprise a semiconductor structure such as a wafer or a portion of a wafer and may be made from silicon, germanium, or other suitable materials. The platinum to be patterned on the substrate may be used for any of a variety of purposes, including but not limited to, forming a resistor, forming a capacitor, or metallization purposes. The substrate 101 may already include a structure formed thereon and thus may not be completely flat. In one embodiment, the platinum is patterned in order to conduct current among different electrical components of an integrated circuit. In an alternative embodiment, the other integrated circuit components are formed subsequent to patterning platinum on the substrate 101.

Referring still to FIG. 1A, an adhesive layer 102 is deposited on top of the substrate 101. The adhesive layer 102 may be used to facilitate attachment of other layers to the substrate. For example, the adhesive layer 102 may be made of a material suitable for attaching platinum to a silicon substrate. In some embodiments, the adhesive layer 102 comprises titanium, titanium nitride, or titanium tungsten. In other embodiments, the adhesive layer 102 may comprise a ceramic layer made, for example, from aluminum oxide.

Any of a variety of techniques can be used to deposit the adhesive layer 102 on the substrate 101. The particular technique may depend on the type of material used as the adhesive layer. For example, the adhesive layer may be deposited using any of physical vapor deposition (PVD), chemical vapor deposition (CVD), electrochemical deposition (ECD), or other suitable methods. In one example, the adhesive layer 102 comprises a layer of titanium sputtered on top of the substrate 101. The thickness of the adhesive layer may be about 100 Å, but can be thinner or thicker in other implementations.

While the embodiments shown in FIGS. 1A-1H illustrate the use of an adhesive layer 102, other embodiments may avoid the use of the adhesive layer. In these latter embodiments, the platinum structure may be formed directly on the surface of the substrate 101. For example, in one embodiment, the substrate 101 may be a sapphire substrate ($Al_2O_3$). In this embodiment, a platinum layer may be deposited on the sapphire substrate without an intermediate adhesive layer. In an alternative embodiment, the surface of the substrate 101 goes through a sputter etch process using argon to improve the surface's adhesion.

Figure 1B:
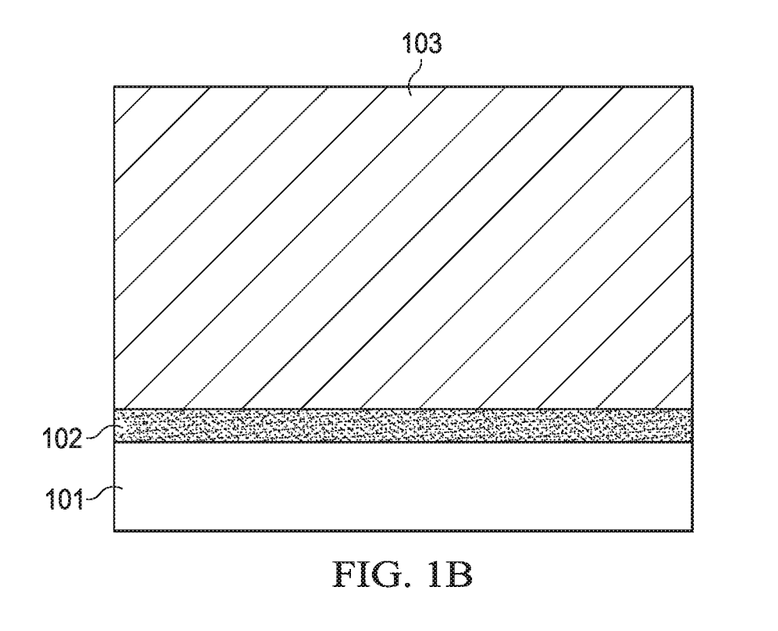
FIG. 1B shows a sacrificial layer formed over the adhesive layer in accordance with an embodiment of the disclosure.

Referring to FIG. 1B, a sacrificial layer 103 is deposited on top of the adhesive layer 102. The sacrificial layer is a layer temporarily deposited on the structure to enable patterning a platinum layer and is subsequently removed. In an embodiment, the sacrificial layer 103 is made from a metal such as aluminum. In an embodiment, any suitable method of depositing aluminum may be used to form the sacrificial layer 103. For example, method of depositing the sacrificial layer 103 may include vapor evaporation, CVD, plasma CVD, or sputtering. In one example, the sacrificial layer 103 may have a thickness of 3000 Å to 18,000 Å. In at least one embodiment, the sacrificial layer comprises aluminum having a thickness between 3000 Å and 18,000 Å and is sputter deposited on top of a titanium adhesive layer 102.

Figure 1C:
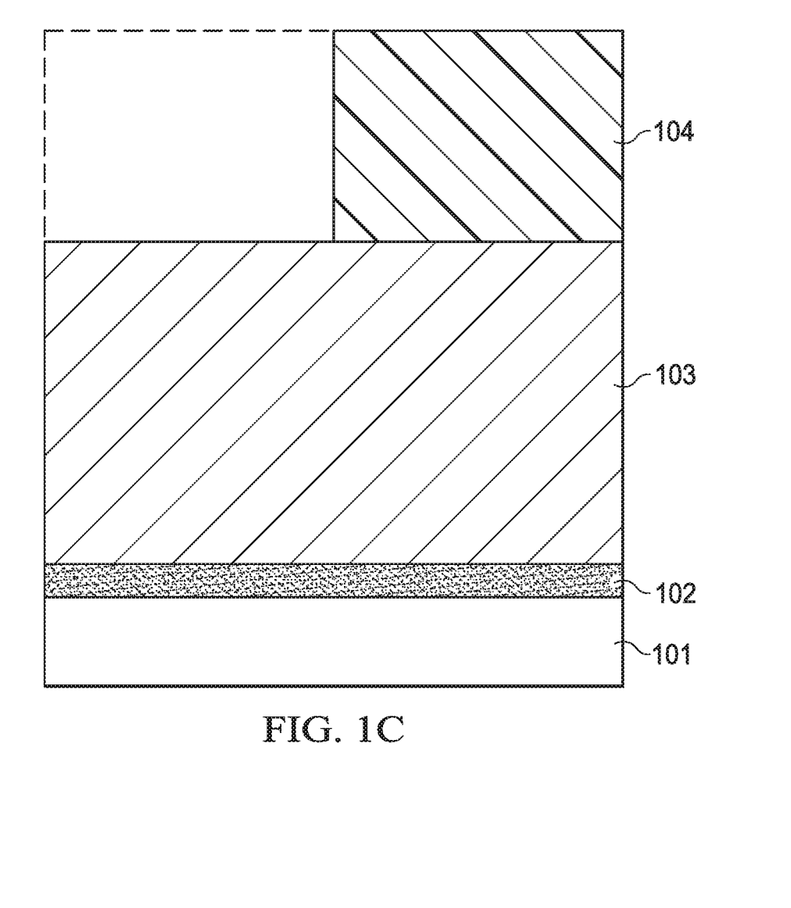
FIG. 1C shows a photoresist formed over the sacrificial layer in accordance with an embodiment of the disclosure.

Referring to FIG. 1C, a photoresist layer 104 is formed over the sacrificial layer 103. Subsequently, the photoresist layer 104 is patterned by, for example, a photolithographic technique to thereby form a mask in the photoresist layer. For example, the photoresist layer 104 may be exposed to a deep ultra-violet (DUV) light in order to form a pattern. In an embodiment, a negative photoresist is used where the portion of the photoresist that is exposed to light becomes insoluble to the photoresist developer (i.e. the unexposed portion of the photoresist will be dissolved). Subsequently, the photoresist developer solution removes the portions of the photoresist layer that are unexposed (the portion shown in FIG. 1C with dashed outline) and the exposed resist remains on the surface of the sacrificial layer 103. Therefore, a resist mask is formed comprising an inverse pattern. In an embodiment, the photoresist layer 104 is resistant against the wet etching or dry etching processes used subsequently to etch the sacrificial layer 103.

Figure 1D:
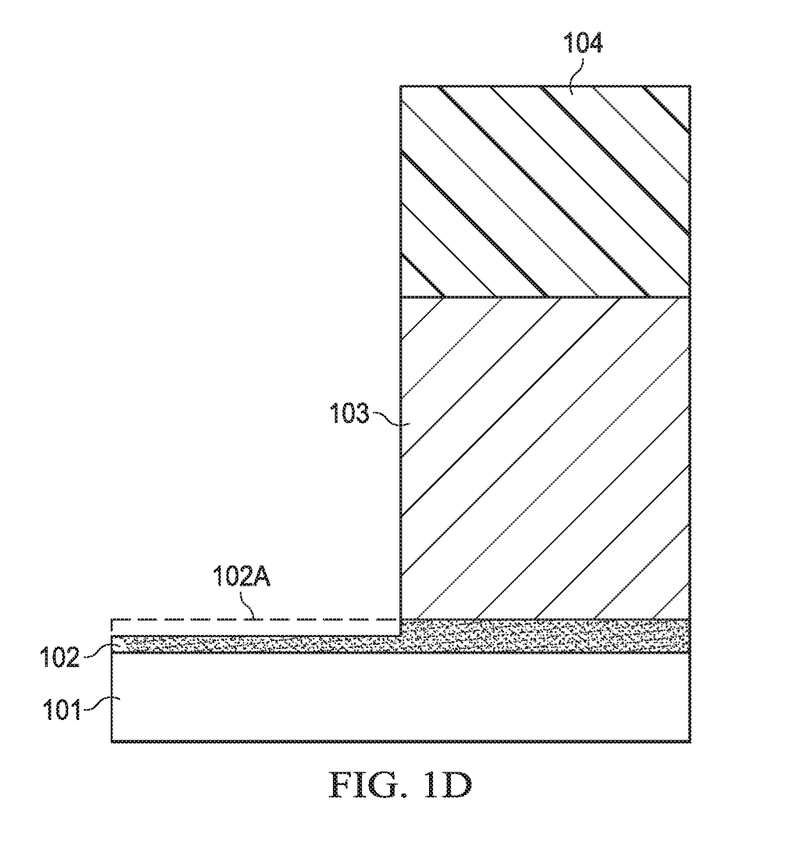
FIG. 1D illustrates the patterning of the sacrificial layer using the photoresist as a mask in accordance with an embodiment of the disclosure.

Referring to FIG. 1D, that portion of the sacrificial layer 103 not covered by the photoresist layer 104 (and thus exposed) is removed. A wet etching process may be used to remove the sacrificial layer 103. For example, for a wet etching process directed at removing an aluminum sacrificial layer, an aluminum leach material such as a mixture of phosphoric acid, acetic acid and nitric acid may be used. In an alternative embodiment, a dry etching process may be used to remove a portion of the sacrificial layer 103. An example of a dry etching process for this purpose includes chloride-based chemistry, such as chlorine, carbon tetrachloride, silicon tetrachloride, and boron dichloride.

In an embodiment, the etching process of FIG. 1D may also remove a top portion 102A of the adhesive layer 102 underneath the removed portion of the sacrificial layer 103 (the portion of the adhesive layer 102 shown in FIG. 1D with dashed outline). In an alternative embodiment, an etchant with high selectivity for the sacrificial layer may be used to solely remove the exposed sacrificial layer 103. Subsequently, the photoresist layer 104 is removed from the top portion of the remaining sacrificial layer 103 (not shown). In an embodiment, the photoresist layer 104 is removed using an oxygen ashing process.

Figure 1E:
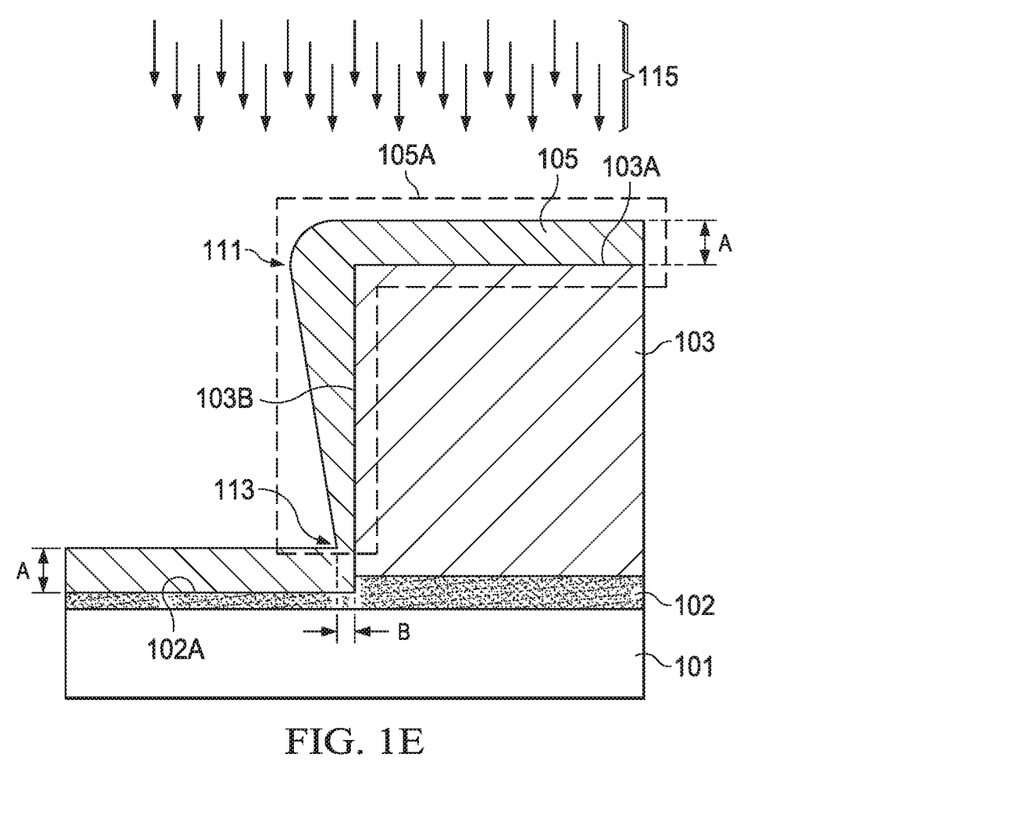
FIG. 1E shows that a platinum layer is deposited over the structure forming a particular profile in accordance with an embodiment of the disclosure.

Referring to FIG. 1E, a platinum layer 105 is formed over the exposed surfaces of the structure, which include the top surface 103A and the sidewall surface 103B of the remaining sacrificial layer 103 in addition to the top surface 102A of the exposed portion of the adhesive layer 102. Depending on the geometry of the sacrificial layer 103, there may be multiple top surfaces 103A, multiple side surfaces 103B and/or multiple top surfaces 102A. Formation of the platinum layer 105 results in the thickness of the platinum layer 105 on the top surface 103A of the sacrificial layer 103 and the top surface 102A of the adhesive layer 102 (indicated in the figure as thickness A) to be generally the same, while the thickness of the platinum layer down the sidewall surfaces 103B tapers from a larger dimension at 111 to a smaller dimension at 113. The thickness of the platinum layer at the bottom of the sidewall surface 103B is shown as thickness B. In an embodiment, any suitable deposition method for platinum layer is used to maximize the thickness A relative to thickness B.

In an embodiment, the ratio of the thickness A with respect to the thickness B is further dependent on the relative thickness of the sacrificial layer 103 with respect to the platinum layer 105. More specifically, for a platinum layer 105 with a given thickness A, a sacrificial layer 103 with a larger thickness forms a platinum layer 105 with a thinner thickness B. In one embodiment, the ratio of A to B is at least 2-to-1. The thickness A may be between 1000 Å to 2500 Å while the thickness B may be about half of that measure dimension. The thickness B represents the thinnest portion of the platinum layer on the bottom corner (indicated by the dotted circle in the figure).

To form the platinum layer 105 with a specific profile such as that shown in FIG. 1E, a non-uniform method of deposition may be employed. In an embodiment, a deposition method is desirable that provide a poor step coverage for the platinum layer 105. In an embodiment, a sputter deposition process is used to form the platinum layer 105. In an embodiment, the sputter deposition is directed vertically in the direction of arrows 115. The non-uniform sputtering coverage of the process facilitates formation of a tapered layer of platinum on the sidewall surface 103B of the sacrificial layer 103. In at least one embodiment, an AC magnetron sputtering is used to deposit the platinum layer 105 under a pressure of approximately 7 m Torr for approximately 170 seconds and a temperature of 250 to 300° C.

Figure 1F:
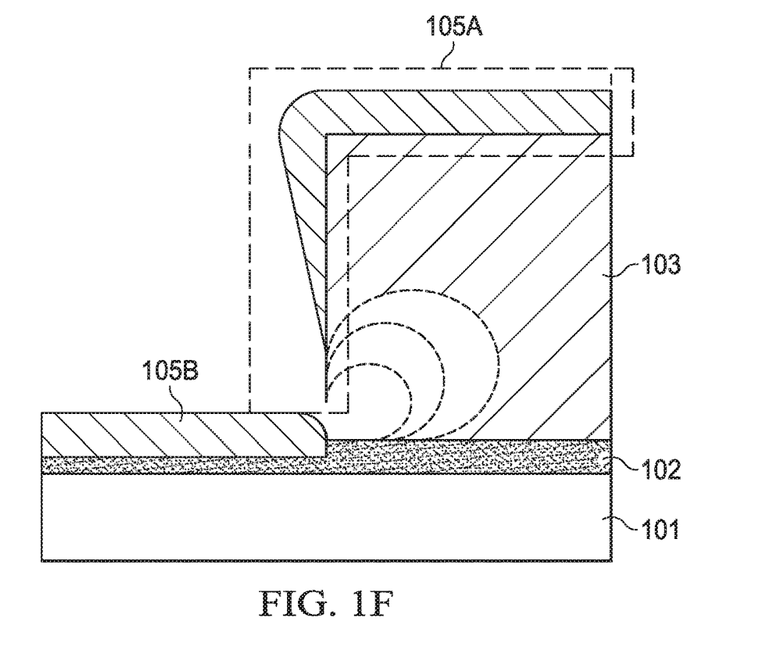
FIG. 1F shows that a portion of the platinum layer covering the sidewall surfaces is etched exposing sacrificial layer to the etchant in accordance with an embodiment of the disclosure.

Referring to FIG. 1F, the portion of the platinum layer 105 covering the top and sidewall surfaces 103A and 103B of the sacrificial layer 103 (shown in FIGS. 2E and 2F as removal portion 105A) and also the sacrificial layer 103 is removed. The remaining portion of the platinum layer 105 that is not removed (platinum layer portion 105B) forms the patterned platinum structure as shown in FIG. 2G. The sacrificial layer 103 and the removal portion 105A of the platinum layer 105 may be removed in a single process step (that is, in one process operation that removes both layers).

A wet etching process may be used to remove the sacrificial layer 103 and the removal portion 105A of the platinum layer 105. As discussed above, the bottom corner of the platinum layer 105, as shown by the arrow 119 in FIG. 1F, is thinner than the rest of the layer and thus may be the breaking point when exposed to the chemical etchant. That is, because the portion of the platinum layer near the bottom of the side wall surface 1036 is thinner than the rest of the platinum layer, the portion of the platinum layer near the bottom of the side wall surface is etched all the way through to the sacrificial layer before the rest of the platinum layer is completely etched. Subsequently, the chemical etchant attacks the sacrificial layer 103 through the opening now formed in the platinum layer 105. In one example, the sacrificial layer 103 is etched 100 times faster than the platinum layer 105. Therefore, the sacrificial layer 103 is etched away and thus removed from the substrate 101 before the platinum layer portion 105B has been completely etched. The platinum layer on the sacrificial layer 103 thus also is removed due to the removal of the sacrificial layer.

In an embodiment, the chemical etchant used to etch through the thin platinum layer at the bottom of the sidewall surface 103B may be selected from a material that is capable of etching both platinum and the sacrificial layer (e.g. aluminum). As noted above, the etchant may react with sacrificial layer 103 more rapidly than with the platinum layer 105. In an embodiment, the chemical etchant comprising hydrochloric acid such as aqua regia in combination with water may be used. In at least one embodiment, the wafer may be submersed in the chemical etchant at a temperature of 50-60° C. for a period of 2 to 5 minute. Shortly after the submersion, the bottom corner of the removal portion 105A of the platinum layer 105 opens up, exposing the sacrificial layer 103 to the chemical etchant. The rapid etching of the sacrificial layer 103 may cause the removal portion 105A of the platinum layer 105 to be removed immediately. In an embodiment, dummy-holes may be formed in sacrificial layer 103 in order to facilitate etching of the layer at a faster rate than the previous embodiments.

Figure 1G:
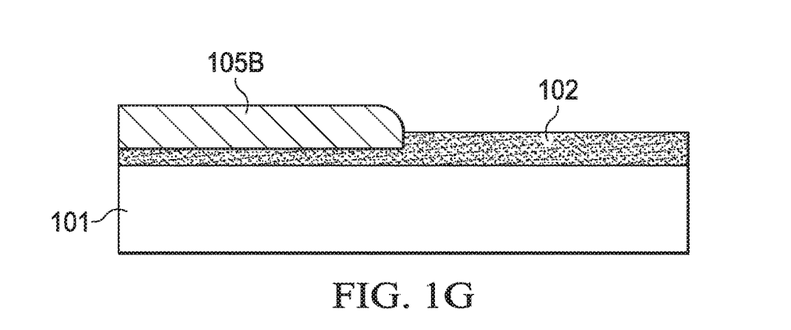
FIG. 1G shows that a portion of the platinum layer is removed in accordance with an embodiment of the disclosure.

Referring to FIG. 1G, the residuals from the removal of the removal portion 105A of the platinum layer 105 and the sacrificial layer 103 are cleaned. In an embodiment, when the wafer is submersed into the chemical etchant in FIG. 1E, the removal portion 105A of the platinum layer 105 and sacrificial layer 103 are removed from the wafer and float in the chemical etchant liquid. Therefore, the residuals may be cleaned in this step to avoid defects in the final products. In an embodiment, one of the known cleaning methods such as an ultrasonic or megasonic bath may be used. In other embodiments, a mechanical agitation method, such as brush scrubbing or rubbing, may compliment the cleaning solutions. Lastly, in other embodiments, the cleaning solution may be sprayed on the wafer with relatively high pressure.

Figure 1H:
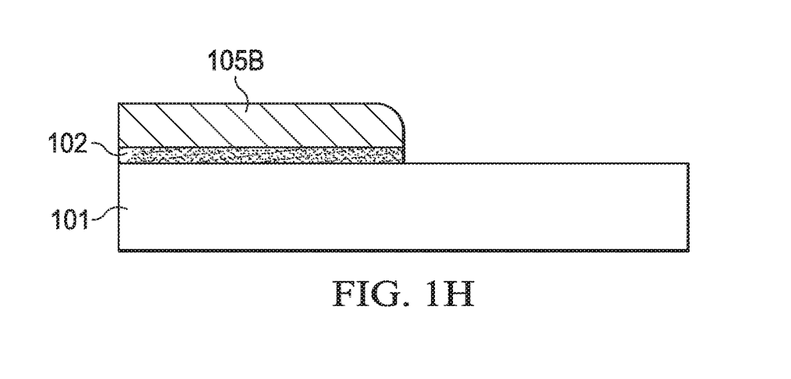
FIG. 1H shows that an exposed portion of the adhesive layer is removed in accordance with an embodiment of the disclosure.

Referring to FIG. 1H, that portion of the adhesive layer 102 not covered by the portion 105B of the platinum layer (that is, the exposed portion of the adhesive layer 102) is removed. The process operation to remove the portion of the adhesive layer 102 may depend on the type of material used to form the adhesive layer. For instance, an adhesive layer 102 made of titanium may be removed by a wet etching process containing hydrofluoric acid etchant. The remaining portion 105B of the platinum layer 105 is the patterned platinum according to an embodiment of the disclosure.

Certain terms are used throughout the following description and claims to refer to particular system components. Different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for patterning platinum, comprising:
   depositing an adhesive layer over a semiconductor substrate;
   depositing a sacrificial layer over the adhesive layer;
   forming a patterned photoresist layer over the sacrificial layer;
   utilizing the photoresist layer as a mask, removing a portion of the sacrificial layer to expose a first portion of the adhesive layer;
   depositing a platinum layer over top and sidewall surfaces of the sacrificial layer and the first portion of the adhesive layer; and
   etching the sacrificial layer and a portion of the platinum layer covering the top and sidewall surfaces of the sacrificial layer thereby leaving a remaining portion of the platinum layer to form a patterned platinum layer on the semiconductor substrate.

2. The method of claim 1, wherein etching the sacrificial layer and a portion of the platinum layer covering the top and sidewall surfaces of the sacrificial layer is performed in a single process step.

3. The method of claim 1, wherein depositing a platinum layer over top and sidewall surfaces of the sacrificial layer and the first portion of the adhesive layer includes performing a sputter deposition process.

4. The method of claim 1, wherein etching the sacrificial layer and a portion of the platinum layer comprises performing a wet etch process for a period of time so as to form an opening in a portion of the platinum layer covering the sidewall surface before the platinum layer covering the top surface is entirely etched.

5. The method of claim 4, wherein the sacrificial layer is exposed to etchant materials of the wet etch process from the opening on the platinum layer covering the sidewall surface and the sacrificial layer is etched at a faster rate than the platinum layer.

6. The method of claim 5, wherein the etchant materials includes aqua regia chemical.

7. The method of claim 1, further comprisinq:
removing a portion of the adhesive layer not covered by the patterned platinum layer.

8. A method for patterning platinum, comprising:
depositing a sacrificial layer over a substrate;
forming a patterned photoresist layer over the sacrificial layer;
patterning the sacrificial layer by utilizing the photoresist layer as a mask to expose a portion of a top surface of the substrate;
sputter depositing a platinum layer on top of the substrate, wherein the platinum layer covers the patterned sacrificial layer and the exposed portion of the top surface of the substrate;
removing the patterned sacrificial layer and a portion of the platinum layer covering the patterned sacrificial layer thereby leaving a remaining portion of the platinum layer to form a patterned platinum layer on the substrate.

9. The method of claim 8, wherein removing the patterned sacrificial layer and a portion of the platinum layer covering the patterned sacrificial layer is performed in a single process step.

10. The method of claim 9, wherein removing the patterned sacrificial layer and a portion of the platinum layer comprises performing a wet etch process for a period of time so as to form an opening in a portion of the platinum layer covering a sidewall surface of the sacrificial layer.

11. The method of claim 8, wherein removing the patterned sacrificial layer and a portion of the platinum layer covering the patterned sacrificial layer comprises a wet etch process using aqua regia etchant.

12. The method of claim 8, wherein sputter depositing the platinum layer on top of the substrate forms a thicker layer of platinum on a top surface of the sacrificial layer and a thinner layer of platinum on a sidewall surface of the sacrificial layer.

13. The method of claim 12, wherein a thickness of the platinum layer on the top surface of the sacrificial layer is at least double a thickness of the platinum layer on the sidewall surface of the sacrificial layer.

14. A method for patterning platinum, comprising:
depositing a titanium layer over a semiconductor substrate;
depositing an aluminum layer over the titanium layer;
forming a patterned photoresist layer over the aluminum layer;
utilizing the photoresist layer as a mask, removing a portion of the aluminum layer to expose a first portion of the titanium layer;
depositing a platinum layer over top and sidewall surfaces of the aluminum layer and the first portion of the titanium layer; and
etching the aluminum layer and a portion of the platinum layer covering the top and sidewall surfaces of the aluminum layer thereby leaving a remaining portion of the platinum layer covering the first portion of the titanium layer to form a patterned platinum.

15. The method of claim 14, wherein etching the aluminum layer and a portion of the platinum layer covering the top and sidewall surfaces of the aluminum layer is performed in a single process step.

16. The method of claim 15, wherein etching the aluminum layer and a portion of the platinum layer comprises a wet etch process using aqua regia etchant.

17. The method of claim 16, wherein etching the aluminum layer and a portion of the platinum layer comprises performing the wet etch process for a period of time so as to form an opening in a portion of the platinum layer covering the sidewall surface before the platinum layer covering the top surface is entirely etched.

18. The method of claim 14, wherein depositing a platinum layer is performed by a sputter deposition step.

19. The method of claim 18, wherein the sputter deposition step forms a thicker platinum layer on the top surface of the aluminum layer and a thinner platinum layer on the sidewall surface of the aluminum layer.

20. The method of claim 19, wherein a thickness of the platinum layer on the top surface of the aluminum layer is at least double a thickness of the platinum layer on the sidewall surface of the aluminum layer.

* * * * *